United States Patent [19]

Edwards

[11] Patent Number: 4,580,193
[45] Date of Patent: Apr. 1, 1986

[54] CHIP TO BOARD BUS CONNECTION

[75] Inventor: John C. Edwards, Wilmore, Ky.

[73] Assignee: International Business Machines Corporation, Armonk, N.Y.

[21] Appl. No.: 691,248

[22] Filed: Jan. 14, 1985

[51] Int. Cl.[4] .............................................. H01R 9/09
[52] U.S. Cl. .................... 361/407; 174/68.5; 361/406; 361/403; 361/397; 357/70; 357/80
[58] Field of Search ................ 174/68.5, 68 FP, 70 B, 174/52 R, 52 PE; 317/101, 101 A, 101 B, 101 CX, 101 CP; 37361/407, 408, 400, 401, 403, 398; 357/65, 68, 70, 80; 339/17 B, 17 CF, 17 LC

[56] References Cited

U.S. PATENT DOCUMENTS

| | | | |
|---|---|---|---|
| 3,562,592 | 2/1971 | Cooke et al. | |
| 3,716,761 | 2/1973 | Rotast | 357/70 X |
| 4,289,384 | 9/1981 | Samek | 174/68.5 X |
| 4,513,555 | 4/1985 | Schroeder et al. | 361/403 |

FOREIGN PATENT DOCUMENTS 57-96561  6/1982  Japan ..................... 357/70
847735  9/1960  United Kingdom ............ 174/68.5

*Primary Examiner*—A. T. Grimley
*Assistant Examiner*—Jane K. Lau
*Attorney, Agent, or Firm*—John A. Brady

[57] ABSTRACT

A configuration is disclosed for attaching leads (15) from several chips (1a-1d) to bus (5a) lines (9a-9m) on a printed circuit board (6). The bus (5a) includes pads (13), each directed toward one of pads (3) on the chip to be connected by arched wires (15). Lines (9a-9l) connected to each end of the board pads (13) and extend generally parallel to the chips (1a-1d) past the sections containing the pads (3). Lines (9a-9l) are displaced alternately toward and away from the chips (1a-1d) at sections containing pads (13) directed toward the chips (1a-1d) or having a part (17) taking a corresponding direction. The pads (13) alternate on opposite sides of each chip (1) to minimize the length of the leads (15) and to allow a central chip pad (3V) for carrying operating voltage (or ground) to connect to the outermost line (9m). This reduces the board space used for a bus (5a) and minimizes the length of wires (15) connecting chips (1a-1d) to a bus (5a).

24 Claims, 4 Drawing Figures

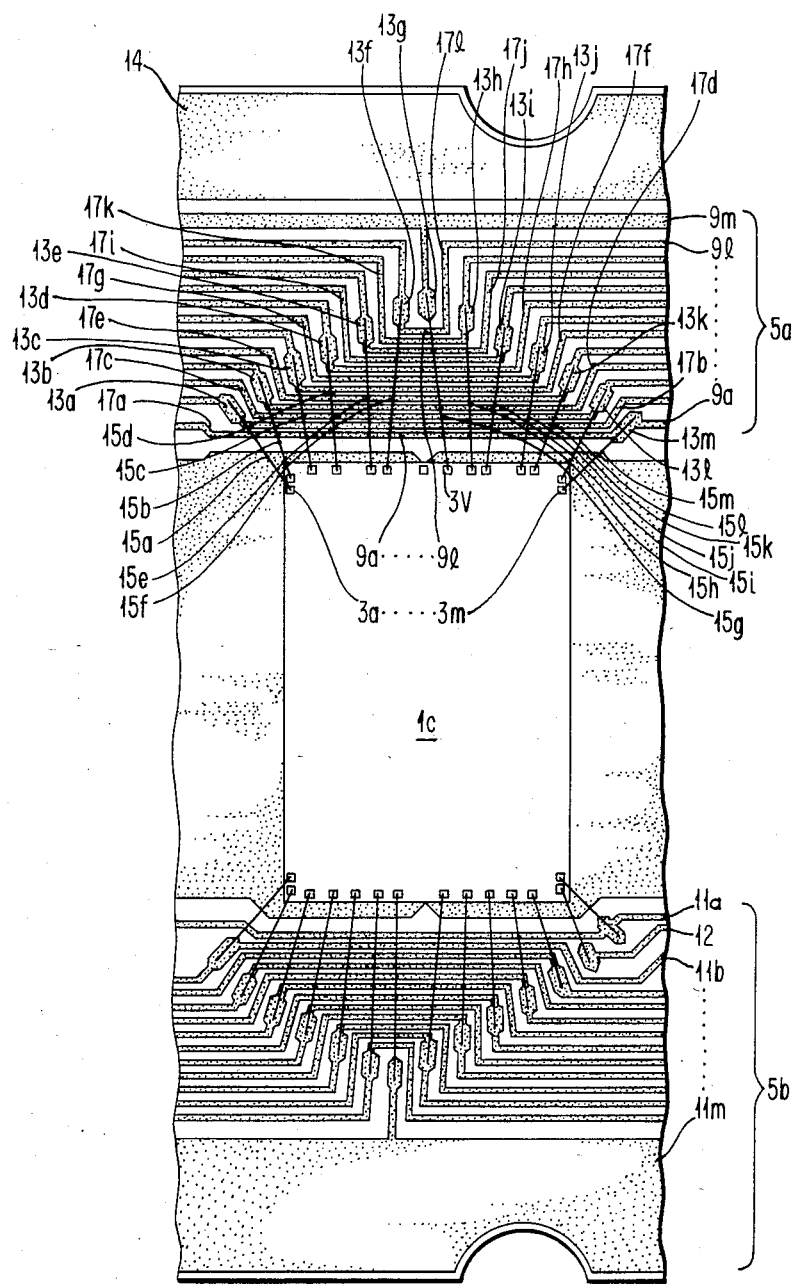
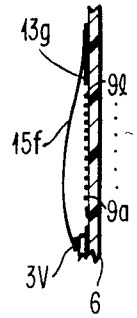
FIG. 2
FIG. 3

CHIP TO BOARD BUS CONNECTION

TECHNICAL FIELD

This invention relates to the space-efficient interconnection of integrated circuit elements of chips to a bus on a circuit substrate or board. The bus comprises a group of lines extending generally parallel which are to be connected to several chips on the board by wires which attach to pads on the chips, the wires being attached to specific pads on the bus and arching over intermediate lines of the bus.

BACKGROUND ART

This invention emloys existing bonding techniques for wires arched between pads of chip pads and pads of bus lines, known as wire bonding. Subsequent to such attachment, the wires are covered with a passivation material, which may be a standard material for that purpose.

U.S. Pat. No. 3,582,592 to Cooke et al is a generally similar overall teaching with respect to this invention. The lines on the circuit board in that patent are entirely straight and do not form significant groups for connection to several chips as a bus. The lines in that patent are apparently so wide that no separate pad is used, bonding of the arched wires being directly to each line. This invention employs a unique pattern to achieve compact interconnection, that pattern being not at all similar to that of the foregoing patent.

DISCLOSURE OF THE INVENTION

In accordance with this invention, wire bonding pads on the board or substrate are located having a long, bonding axis facing the chip. Generally the board pad is aimed more or less directly at the chip pad to be connected, the purpose being to optimize wirebond termination opportunities and to minimize possible shorts due to bonding-wire sag. The pads are spaced laterally along the length of the line of chips to be connected. Leads on the board parallel with the line of chips are connected to the top and bottom end of the bonding axis of each board pad, forming individual lines of a bus including the pad and the board leads to each end of the pad. Contiguous bus lines in a section including the board pads are directed toward the chip line either by including pads so directed or by having line sections parallel or spaced from the pads. A second section of the bus has similar pads or line parts from which the bus lines continue at a position reversing the displacement of the first section. Similar alternating sections occur along the bus.

Generally, available space along the line of chips is not a limiting factor and the pads can be laterally spaced or fanned out so that the board pads have little cumulative effect on the spacing of the bus perpendicular to the chips. The perpendicular width of the bus then can be as small as the sum of total line width, plus total line spacing, plus the effective length in the perpendicular direction of the one board pad having the longest effective perpendicular length. This reduces the board space used for a bus and minimizes the length of wires connecting chips to a bus.

DESCRIPTION OF THE DRAWING

The invention is described in detail below, with reference to drawing in which:

FIG. 2 is an enlarged view of a middle one of those chips and the associated buses.

FIG. 3 is a side view of a section of FIG. 2 illustrative of the arching of the wries interconnecting the chips and the buses.

DESCRIPTION OF THE BEST MODE FOR CARRYING OUT THE INVENTION

Figure 1:
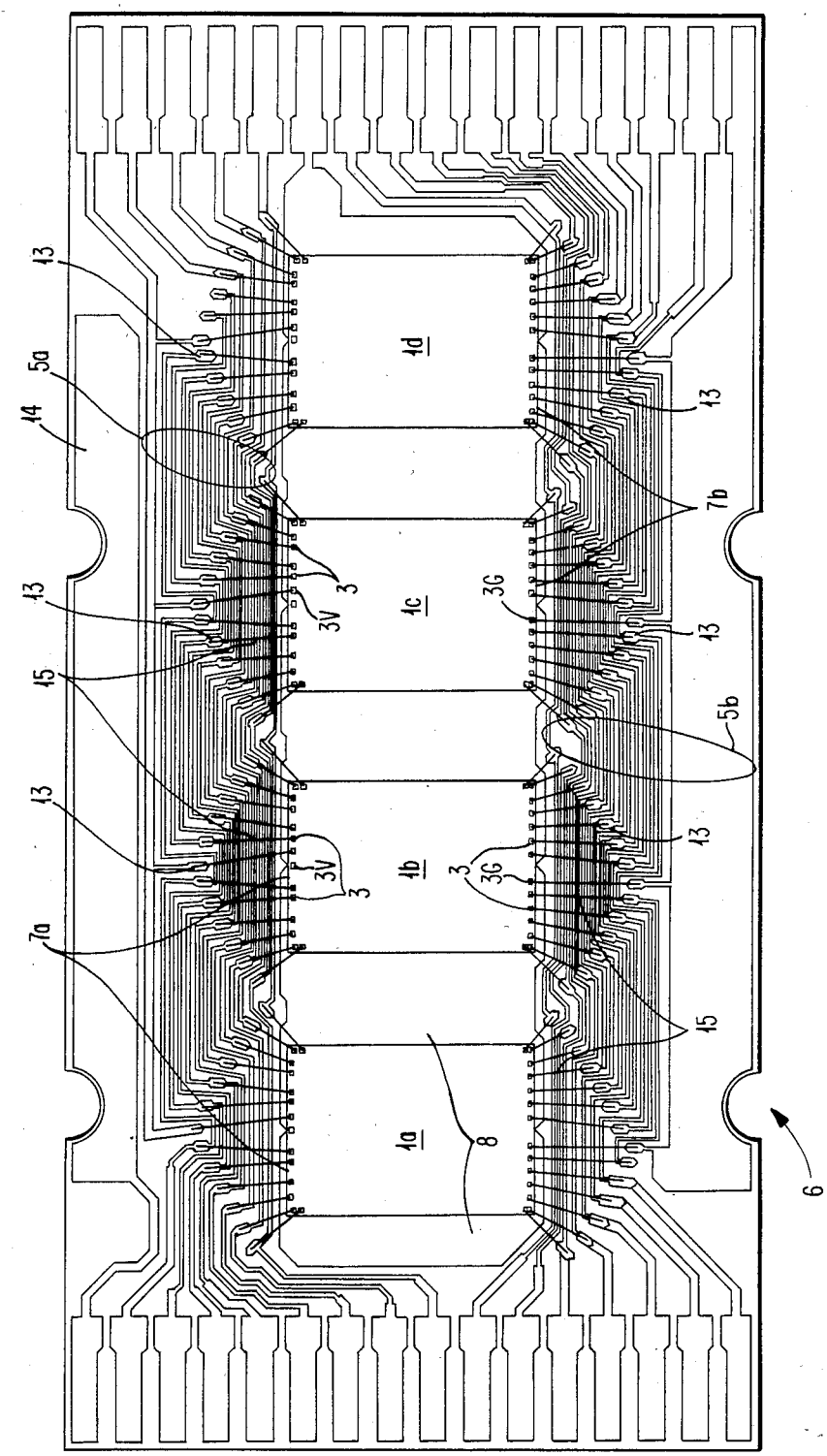
FIG. 1 is a view of the preferred and best implementation, having four memory chips on a circuit board.

The drawings shows a preferred implementation with four chips 1a, 1b, 1c and 1d, each being a 64K bit semiconductor memory. The memories each may be a conventional random access memory (RAM) or a conventional read only memory (ROS) or some modification of such memories. Chips 1a–1d have a number of chip pads 3, some of which receive and transmit single bits as data and others of which receive single bits as address signals. These pads in this case being connected to common buses 5a and 5b. Other of chip pads 3 receive a chip select signal, as is conventioanl, which selects or activates one of the chips 1a, 1b, 1c and 1d, while the remaining three chips are not activated. In this preferred embodiment, the chip select lines are positioned within bus 5b thereby permitting their convenient location with respect to its associated chip pads 3.

More specifically, chips 1a–1d comprise RAM memories and each chip 1a–1d has a pad 3 which receives a read/write signal, as is conventional, to differentiate between a read operation, which extracts data from the RAM, and a write operation, which alters the contents stored. The read/write select pad 3 is connected to a line in one of the buses 5a and 5b.

In the implementation shown, each chip 1a–1d has eight data pads 3, thirteen address pads 3, one chip-select pad 3, and one read/write select pad 3. No effort is made in this description to describe comprehensively which of the pads 3 is connected for each of the foregoing operations, as this invention is not at all dependent upon the function of the signals on the chip pads 3 and as that may vary depending on the design of the chips 1a–1d. Additionally, each chip 1a–1d is designed to receive operating voltage on one pad 3V and to be connected to a ground reference voltage on another pad 3G. The pads 3G for ground and 3V for operating voltage are in the middle area of the line of pads 3 on the margin of each chip 1a–1d. The specific aspects of this embodiment permit the operating voltage and ground to be at the outer side of the buses 5a and 5b on the circuit board 6.

Chips 1a–1d are mounted on a circuit board 6 in a line with their opposite margins 7a and 7b parallel to that line. Margins 7a and 7b contain pads 3, typically about half on the one margin 7a and half on one margin 7b. The physical mounting of chips 1a–1d may be by electrically conductive adhesive or the like, as is conventional. Chips 1a–1d are positioned on an underlying conductive layer 8, which during operation is held at a predetermined substrate voltage, as is conventional. Generally parallel to the line of chips 1a–1d and printed on board 6 is bus 5a of conductors on the side near margin 7a and the bus 5b on the side near margins 7b, as is conventional.

FIG. 2 is a more magnified illustration of one of the chips, in this case chip 1c as connected to buses 5a and 5b. Buses 5a and 5b each comprise 13 lines, 9a through 9m for bus 5a and 11a–11m for bus 5b, the outer line 9m being the operating voltage line and the outer line 11m being the ground line, and therefore being large in area to provide shielding as is conventional. Line 12 within bus 5b is the chip select line for that chip and therefore does not extend further toward chip 1b. Bus 5b will not be further mentioned in detail since discussion of bus 5a is directly applicable to bus 5b for the purposes of this invention. The wide region 14 above bus 5a is also conductive and held at ground during operation to provide shielding.

Referring again to FIG. 1, buses 5a and 5b have wider portions 13 which serve as terminals or pads. The wide portions provide area necessary to permit an end of wires 15 to be bonded to pads 13. The other ends of wire 15 are bonded to a pads 3 on chips 1a–1d.

Board pads 13 have a long axis along which wires 15 are bonded. As wires 15 are not wide, pads 13 need not be wide in the direction transverse to bonding. Accordingly, the preferred pad 13 has a long, bonding axis pointing at a corresponding chip pad 3 and a narrower dimension transverse to the bonding axis. The narrow transverse dimension conserves space. Individual ones of wires 15 connect one pad 3 on one chip 1a–1d to one pad 13 of buses 5a or 5b which is pointed toward that pad 3. (Identical connections are made to the chip-select line, which, in fact, are located within bus 5b.) Wires 15 extend over intermediate circuit elements and are sufficiently rigid as to not sag onto the board, thereby making an undesired electrical contact. Thus, for example, as illustrated by the cross-sectional view of FIG. 3, the wire denoted 15f extends over lines 9a–9k, and terminates on the pad 13f of line 91.

After fabrication of all connections of wires 15 to chip pads 3 and substrate pads 13, that part of the assembly including wires 15, pads 3, pads 13 and chips 1a–1d is covered with a passivation agent. The efficiency of the completed assembly requires that a seal against moisture and ionic contaminants (typically chlorine and potassium) be provided at the outer surface of chips 1 and wires 15 as well as the interstitial zones. Typically a high purity, low terminal expansion epoxy material is applied as a liquid and hardened in place. Such conventional practice is effective only if a stress relief zone or open space is provided between chips 1a–1d to minimize the cumulative thermal strains created by the different thermal coefficients of expansion of the encapsulated components working against the encapsulation material.

Less common but still conventional is the application of a thin conformal coating as a passivation agent, which surrounds individual elements rather than encapsulating groups of them. Such fabrication, including the connection of arched wires 15 followed by passivation, may be conventional and forms no part of this invention.

In the more enlarged illustration of FIG. 2, pads 13 of bus 5a are denominated pads 13a through 13m to facilitate discussion. Similarly chip pads 3 of margin 7a are denominated pads 3a through 3f, 3V, and 3h through 3m, the pad 3V being given a designation relating to its function of receiving the operating voltage. Wires 15 are similarly denominated. Accordingly, pads 3a and 13a are connected by arched wire 15a. Pads 3b and 13b are connected by wire 15b, with the other connection following that patten, pad 3V being connected to pad 13g by wire 15g.

Preferably the long, bonding axis of each board pad 13a–13m is directed toward or aimed at the associated chip pad 3a–3f, 3V and 3h–3m, to which it is connected by the corresponding wire 15a–15m. this aiming provides the longest effective area for bonding of the end of the corresponding wire 15a–15m, and minimizes the potential of wire sag producing a short with adjacent bus lines or pads. Pads 13 are made significantly wider than wires 9, such width and aiming of the long axis being desirable in the conventional practice of chip wirebonding.

The outermost pad 13g is generally central to chip 1c and therefore its long axis is generally perpendicular to the line of chips 1a–1d (FIG. 1). Pad 13g therefore takes the maximum space across the width of bus 5a. The other pads, 13a–13f and 13h–13m are the same size as pad 13g but are not perpendicular to the line of chip 1a–1d and therefore require somewhat less space across the width of bus 5a.

Pads 13 are located close to chips 1a–1d to minimize the length of wires 15. in the preferred embodiment illustrated in FIG. 1 and 2, the space available for buses 5a 5b permits a wider separation between the individual line 9a–9m and 11a–11m than the minimum possible without interline short circuits and the like. The wider spacing is normally more reliable and less costly to fabricate, so the lines such as lines 9a–9m are more widely spaced in the region between chips 1a–1d. The region proximate or closest to the chips 1a–1d, that at which the pads 13a–13m of FIG. 2 are located, have lines 9a–9m as closely spaced as possible. This locates pads 13a–13m as close to chip 1c as possible. The wide spacing is achieved by having line 9a intersect pad 13m somewhat internal to its long axis and parallel to the line of chips 1a–1d. Line 9c intersects pad 131 at the outer end of its long axis and parallel to the line of chips 1a–1d. Lines 9e, 9g, 9i and 9h have progressively longer parts extending in the direction of the long axis of the one of pads 13k, 13j, 13i and 13h, respectively, to which each connects, followed by parts parallel to the line of chips 1a–1d. The section having pads 13a–13f has essentially the same configuration, with line 9b intersecting pad 13a somewhat internal of its long axis and line 91 having the longest part extending in the direction of the long axis of the pad 13 to which it connects.

Lines 9a through 9m, with the exception of line 9m, the outer line, are connected to opposite ends of the long axis of the corresopnding pads 13a–13f and 13h–13m to which they connect. The pads 13a–13f and 13h–13m are part of the electrical continuity of bus 5a. Line 9a, the line closest to chip 1c contacts pad 13m at the end of pad 13m farthest from chip 1c. Line 9a is connected to the opposite side of pad 13m and therefore has a length extending across the middle region of chip 1c which is displaced toward chip 1c an amount equal to the component of the length of pad 13m which is perpendicular to the line of chips 1a–1d. The next line, line 9b, finds no pad near pad 13m, but has a part 17b generally following pad 13m so as to be substantially spaced from the edge of pad 13m, thereby also displacing line 9b toward chip 1b. This pattern is repeated to pad 13h. Thus, line 9c connects to the end of pad 131 more distant from chip 1c and connects to the opposite end of pad 131 from which line 9c extends across the middle of chip 1c. Line 9b does not connect to a pad, but has a part 17d which generally folows pad 131 and is spaced from it. This relationship continues through pad 13g of line 9m with the exception that line 9m connects only to the outer side of pad 13g.

The group of pads 13m, 13l, 13k, 13j, 13i, and 13h along with parts 17b, 17d, 17f, 17h, 17j and 17l form a section in which lines 9a-9l are spaced and approximately in parallel and are one distance from the line of chips 1a-1d on one side of the pads 13h-13m and are displaced a different distance from the line of chips 1a-1d, on the other side of those pads. The amount of the displacement is that of the section containing pads 13m, 13l, 13k, 13j, 13i and 13h and parts 17b, 17d, 17f, 17h, 17i and 17l which has a direction toward the line of chips 1a-1d.

More specifically, in FIG. 2 those lines in bus 5a are closer to the chip 1c in the central part to the left of the pads 13h-13m. On the other side of chip 1c is a basically similar section having lines pads 13a-13f and parts 17a, 17c, 17e, 17g, 17i and 17k between and alternating with the pads 13a-13f. The middle expanse of lines 9a-9l contact the bottom of pads 13a-13f or parts 17a, 17c, 17e, 17g, 17i and 17k where there is no pad. This reverses the displacement of the adjoining section, resulting in lines 9a-9l being displaced outward perpendicular from the line of chips 1a-1d the same amount as the previous inward displacement of lines 9a-9l in the region central and proximate to chip 1c.

The lines 9a-9m and pads 13a-13m, may be as close together at every point as the minimum interline spacing allowed by the technology involved. They avoid contact by being displaced as groups. As the sections having displacement toward and away from the chips alternate (FIG. 1), the total minimum required area need be expanded ony by the length of the longest component of all the pads 13a-13m which is perpendicular to the line of chips 1a-1d. As discussed above, the embodiment shown permits extra spacing between the lines 9a-9m in the regions between chips 1a-1d. To utilize this as described, the sections having displacement generally contain both pads 13a-13m and parts of lines 9c-9m extending in the same direction as the long axis of the pads 13a-13m to which each line connects. Where use of space on board 6 is to be minimized, the parts of lines 9c-9m extending past the pads 13 and in the direction of the long axis of pads 13 would be eliminated. The interline spacing of line 9a-9m in the regions between chips 1a-1d would then be as close as that in the regions proximate to chips 1a-1d.

It will be noted that where a line, such as line 9a, is displaced in one direction, this need not influence other lines which are positioned away from the direction of displacement. It is for this reason that line 9m simply connects to the end of pad 13g farthest from chip 1c and has a single part extending across the line of chips 1a-1d spaced a fixed distance from the line of chips 1a-1d. The continuing outward position may be maintained as there is no line farther outward to be influenced.

This preferred arrangement of lines 9 containing parts 17 and pads 13 is provided for the purpose of minimizing the maximum length of wires 15, the longest being wire 15g. The length of wire 15g is a function of the number and center-to-center spacing of lines 9 in the area between pad 13g and chip 1c. Such spacing is dependent upon the width of the lines 9 and the spacing between lines 9, as well as the distance between the edge of bus 5a and the adjoining one of chips 1a-1d. As refinements permit reduced spacing of these elements, the distance between pad 13g and chip 1c will be reduced and as a result wire 15g will be made shorter.

This is attractive, because shorting possibilities are reduced, as has been noted, and problems related to solid passivations can be minimized.

Figure 4:
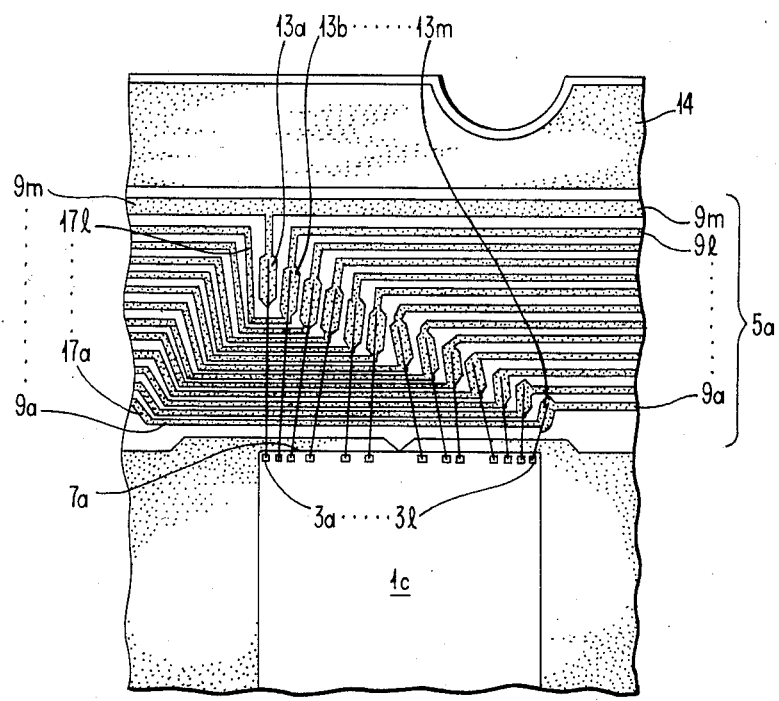
FIG. 4 is entirely illustrative of an alternative implementation of primary interest in describing the scope of this invention.

In the FIG. 4 arrangement, all of the pads 13a through 13m are contiguous and form a group of pads in a section which displaces the location of lines 9a-9l from the margin 7a of chip 1c. All of the displacement parts 17a-17l form a group opposite the group of pads 13a-13m. As shown, pads 13a through 13m occupy most of the space near chip 1c, but the lesser space for the section of parts 17a-17l having a return displacement normally would be availavle prior to the area needed for a displacement section of pads 13 related to the adjoining chip 1b.

It will be apparent that alternative configurations may be adopted without departing from the essential aspects of this invention. Accordingly, patent coverage should be as provided by law, with particular reference to the following claims.

What is claimed is:

1. A chip to circuit board interconnection assembly comprising a plurality of semiconductor chips mounted on said board, a plurality of contact pads on each chip of said plurality of chips, a plurality of contact pads on said board, each of said board pads having a bonding axis pointed generally at a different one of said chip pads, a plurality of electrical conductor lines on said board, said lines connecting to opposite sides of said bonding axis of said board pads, said lines and said board pads being spaced from adjoining ones of said lines and said board pads to form a bus following a path which is directed alternately toward and away from said chips, said bus having alternating sections, one of said sections displacing said bus toward said chips and the other of said sections displacing said bus away from said chips.

2. The assembly as in claim 1 in which said board pads for at least one of said chips has the most distant board pad generally opposite the center of said one chip with board pads and parts of lines alternating on each side of said most distant board pad with each board pad next closer to one side of said chip having a bonding axis pointing at a chip pad farther away from said center of said one chip on that side of said one chip.

3. The assembly as in claim 2 in which said lines and said board pads are generally equally spaced from adjoining ones of said lines and said board pads.

4. The assembly as in claim 3 in which at least some of said lines have a part extending from said board pad to which it is connected generally in the direction of the bonding axis of that board Pad and forming a part of one of said sections, said extending parts being located on the side of said board pads away from said chips to separate said lines more in the region between said chips than said lines are separated in the region proximate to at least one of said chips.

5. The assembly as in claim 2 in which at least some of said lines have a part extending from said board pad to which it is connected generally in the direction of the bonding axis of that board pad and forming a part of one of said sections, said extending parts being located on the side of said board pads away from said chips to separate said lines more in the region between said chips than said lines are separated in the region proximate to at least one of said chips.

6. The assembly as in claim 1 in which said lines and said board pads are generally equally spaced from adjoining ones of said lines and said board pads.

7. The assembly as in claim 6 in which at least some of said lines have a part extending from said board pad to which it is connected generally in the direction of the bonding axis of that board pad and forming a part of one of said sections, said extending parts being located on the side of said board pads away from said chips to separate said lines more in the region between said chips than said lines are separated in the region proximate to at least one of said chips.

8. The assembly as in claim 1 in which at least some of said lines have a part extending from said board pad to which it is connected generally in the direction of the bonding axis of that board pad and forming a part of one of said sections, said extending parts being located on the side of said board pads away from said chips to separate said lines more in the region between said chips than said lines are separated in the region proximate to at least one of said chips.

9. A circuit board for mounting a plurality of circuit chips generally on a line, each chip having a plurality of first connection terminals, said circuit board supporting leads for bus connection to said chips, said circuit board supporting second connection terminals having a bonding axis directed generally toward said line, said leads connecting to one of said second terminals at opposite ends of said bonding axis, said leads and said second terminals forming a bus of spaced, electrically continuous paths extending across said board generally parallel to said line with section directed alternately toward and away from said line, said paths having at least three of said sections in which said paths are directed generally toward said line, said at least three sections being in spaced locations along said bus and alternating between being a section bringing said paths closer to said line and a section bringing said paths farther from said line.

10. The circuit board as in claim 9 in which said second connection terminals for at least one of said chips has the most distant terminal generally opposite the location of the center of said one chip with said second terminals and parts of leads alternating on each side of said most distant terminal with each second terminal next closer to one side of the location of said chip having a bonding axis pointing at the location of a first connection terminal farther away from said location of the center of said one chip on that side of said one chip.

11. The circuit board as in claim 10 in which said leads and said second connection terminals are generally equally spaced from adjoining ones of said leads and said second conection terminals.

12. The circuit board as in claim 11 in which at least some of said leads have a part extending from said second connection terminal to which it is connected generally in the direction of the bonding axis of that second connection terminal and forming a part of one of said sections, said extending parts being located on the side of said second connection terminals away from said line to separate said leads more in the region between said chips than said lines are separated in the region proximate to at least one of said chips.

13. The circuit board as in claim 10 in which at least some of said leads have a part extending from said second connection terminal to which it is connected generally in the direction of the bonding axis of that second connection terminal and forming a part of one of said sections, said extending part being located on the side of said second connection terminals away from said line to separate said leads more in the region between said chips than said lines are separated in the region proximate to at least one of said chips.

14. The cirucit board as in claim 9 in which said leads and said second connection terminals are generally equally spaced from adjoining ones of said leads and said second connection terminals.

15. The circuit board as in claim 14 in which at least some of said leads have a part extending from said second connection terminal to which it is connected generally in the direction of the bonding axis of that second connection terminal and forming a part of one of said sections, said extending parts being located on the side of said second connection terminals away from said line to separate said leads more in the region between said chips than said lines are separated in the region proximate to at least one of said chips.

16. The circuit board as in claim 9 in which at least some of said leads have a part extending from said second connection terminal to which it is connected generally in the direction of the bonding axis of that second connection terminal and forming a part of one of said sections, said extending parts being located on the side of said second connection terminals away from said line to separate said leads more in the region between said chips than said lines are separated in the region proximate to at least one of said chips.

17. A chip to circuit board interconnection assembly comprising at least three semiconductor chips mounted on said board, each of said chips having plural pads for connection by wires extending generally in a first direction, an electrical bus on said board located proximate to said chip pads and extending generally perpendicular to said first direction with alternate displacements toward and away from said chips, said bus having leads and having pads for connection by wires extending from said chip pads, each of said bus pads being pointed generally at a different one of said chip pads, said leads avoiding contacting adjacent board pads by having parts which follow said adjacent board pads and are spaced from said adjacent board pads, said parts being either leads only or being comprised of board pads connected to said leads, said bus having groups of said parts, said groups alternately displacing said bus toward said chips and away from said chips to form said alternate displacements, and a plurality of wires connecting said chip pads and said board pads by individual ones of said wires being connected to one of said chip pads and to one of said bus pads pointed toward that one chip pad.

18. The assembly as in claim 17 in which said leads extending in the regions between said chips connect to the end of said bus pads farthest from said chips and said leads extending in the regions closest to said chips connect to the end of said bus pads closest to said chips.

19. The assembly as in claim 18 in which said bus pads for each of said chips has the most distant bus pad generally opposite the center of said chip with board pads and leads alternating in said groups, with each board pad next closer to one side of said chip pointing at a chip pad farther away from said center of said one chip on that side of said one chip.

20. The assembly as in claim 19 in which at least some of said leads have a part extending from a bus pad from the side of said bus pads away from said chips to form part of said groups and to separate said leads in said regions between said chips more than said leads are separate in said regions closest to said chips.

21. The assembly as in claim 18 in which at least some of said leads have a part extending from a bus pad from the side of said bus pads away from said chips to form part of said groups and to separate said leads in said regions between said chips more than said leads are separate in said regions closest to said chips.

22. The assembly as in claim 17 in which said bus pads for each of said chips has the most distant bus pad generally opposite the center of said chip with board pads and leads alternating in said groups, with each baord pad next closer to one side of said chip pointing at a chip pad farther away from said center of said one chip on that side of said one chip.

23. The assembly as in claim 22 in which at least some of said leads have a part extending from a bus pad from the side of said bus pads away from said chips to form part of said groups and to separate said leads in said regions between said chips more than said leads are separate in said regions closest to said chips.

24. The assembly as in claim 17 in which at least some of said leads have a part extending from a bus pad from the side of said bus pads away from said chips to form part of said groups and to separate said leads in said regions between said chips more than said leads are separated in said regions closest to said chips.

* * * * *